US010164216B2

United States Patent
Acharya et al.

(10) Patent No.: US 10,164,216 B2
(45) Date of Patent: Dec. 25, 2018

(54) BASE SUBSTRATE WITH POLYMER MATERIAL HAVING A GRADIENT DISTRIBUTION FOR ORGANIC LIGHT EMITTING DIODE

(71) Applicant: BOE TECHNOLOGY GROUP CO., LTD., Beijing (CN)

(72) Inventors: Rajendra Acharya, Gainesville, FL (US); Xiangyu Fu, Gainesville, FL (US); Cheng Peng, Gainesville, FL (US); Ying Chen, Gainesville, FL (US); Shuyi Liu, Gainesville, FL (US); Franky So, Gainesville, FL (US); Kirk S. Schanze, Gainesville, FL (US); Szuheng Ho, Gainesville, FL (US)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/552,062

(22) PCT Filed: Aug. 22, 2016

(86) PCT No.: PCT/CN2016/096194
§ 371 (c)(1),
(2) Date: Aug. 18, 2017

(87) PCT Pub. No.: WO2017/148110
PCT Pub. Date: Sep. 8, 2017

(65) Prior Publication Data
US 2018/0069197 A1    Mar. 8, 2018

(30) Foreign Application Priority Data
Feb. 29, 2016    (CN) .......................... 2016 1 0111585

(51) Int. Cl.
*H01L 51/52*    (2006.01)
*H01L 27/32*    (2006.01)
*H01L 51/56*    (2006.01)

(52) U.S. Cl.
CPC ...... *H01L 51/5268* (2013.01); *H01L 27/3246* (2013.01); *H01L 51/5218* (2013.01);
(Continued)

(58) Field of Classification Search
CPC ..................... H01L 51/5268; H01L 51/5271
(Continued)

(56) References Cited

U.S. PATENT DOCUMENTS 7,903,055 B2 *  3/2011  Nishikawa .......... H01L 51/5209
                                                   257/40
2010/0157453 A1  6/2010  Su et al.
(Continued)

FOREIGN PATENT DOCUMENTS

CN    101750778 A    6/2010
CN    104380843 A    2/2015
(Continued)

OTHER PUBLICATIONS

International Search Report & Written Opinion dated Dec. 1, 2016 regarding PCT/CN2016/096194.
(Continued)

*Primary Examiner* — Robert Huber
(74) *Attorney, Agent, or Firm* — Intellectual Valley Law, P.C.

(57) ABSTRACT

The present application discloses an organic light emitting diode base substrate including a support substrate and a light outcoupling layer on the support substrate for enhancing light outcoupling efficiency of an organic light emitting display substrate, the light outcoupling layer having a corrugated surface on a side of the light outcoupling layer distal
(Continued)

to the support substrate. The light outcoupling layer including a polymer material having a gradient distribution in a direction from the corrugated surface to the support substrate.

20 Claims, 7 Drawing Sheets

(52) U.S. Cl.
CPC ...... *H01L 51/5253* (2013.01); *H01L 51/5262* (2013.01); *H01L 51/5271* (2013.01); *H01L 51/56* (2013.01)

(58) Field of Classification Search
USPC ............... 257/40, 98, E51.018, E33.068
See application file for complete search history.

(56) References Cited

U.S. PATENT DOCUMENTS

| | | |
|---|---|---|
| 2014/0167017 A1 | 6/2014 | Shinotsuka et al. |
| 2014/0306213 A1 | 10/2014 | Sato et al. |
| 2015/0060840 A1 | 3/2015 | Nishimura et al. |
| 2016/0028031 A1 | 1/2016 | Nakayama et al. |
| 2017/0170434 A1 | 6/2017 | Yoo et al. |

FOREIGN PATENT DOCUMENTS

| | | |
|---|---|---|
| CN | 105189108 A | 12/2015 |
| JP | 2003243152 A | 8/2003 |
| JP | 2012028067 A | 2/2012 |
| WO | 2013005638 A1 | 1/2013 |
| WO | 2013073434 A1 | 5/2013 |
| WO | 2015080422 A1 | 6/2015 |

OTHER PUBLICATIONS

Chandra et al., "Self-Wrinkling of UV-Curved Polymer Films", Advanced Materials, 23, 3441-3445, Jul. 1, 2011.

Gan et al., "Self-Wrinkling Induced by the Photopolymerization and Self-Assembly of Fluorinated Polymer at Air/Liquid Interface", Journal of Materials Chemistry A, 2, 18574-18582, 2014.

Lee et al., "Enhanced Light Out-Coupling of OLEDs with Low Haze by Inserting Randomly Dispersed Nanopillar Arrays Formed by Lateral Phase Separation of Polymer Blends", Small, 9, 3858-3863, May 31, 2013.

Chinese First Office Action in the Chinese Patent Application No. 201610111585.3, dated Jul. 3, 2017; English translation attached.

\* cited by examiner

BASE SUBSTRATE WITH POLYMER MATERIAL HAVING A GRADIENT DISTRIBUTION FOR ORGANIC LIGHT EMITTING DIODE

CROSS-REFERENCE TO RELATED APPLICATION

This application is a national stage application under 35 U.S.C § 371 of International Application No. PCT/CN2016/096194 filed Aug. 22, 2016, which claims priority to Chinese Patent Application No. 201610111585.3, filed Feb. 29, 2016, the contents of which are incorporated by reference in the entirety.

TECHNICAL FIELD

The present invention relates to a base substrate for an organic light emitting diode, an organic light emitting display substrate and apparatus having the same, and a fabricating method thereof.

BACKGROUND

As compared to other display devices such as liquid crystal display (LCD) devices, the organic light emitting diode (OLED) display devices are self-emitting apparatuses that do not require a backlight. Having the advantages of fast response, a wider viewing angle, high brightness, more vivid color rendering, thinner and lighter, they have found a wide range of applications in display field. Typically, OLED display apparatuses may be categorized into three types, a top-emission type OLED, a bottom-emission type OLED, and a dual-emission type OLED.

SUMMARY

In one aspect, the present invention provides an organic light emitting diode base substrate comprising a support substrate; and a light outcoupling layer on the support substrate for enhancing light outcoupling efficiency of an organic light emitting display substrate, the light outcoupling layer having a corrugated surface on a side of the light outcoupling layer distal to the support substrate, the light outcoupling layer comprising a polymer material having a gradient distribution in a direction from the corrugated surface to the support substrate.

Optionally, the polymer material comprises a hydrophobic polymer material having a gradient distribution such that a content of the hydrophobic polymer material decreases in the direction from the corrugated surface to the support substrate.

Optionally, the light outcoupling layer further comprises a hydrophilic material having a gradient distribution such that a content of the hydrophilic material increases in the direction from the corrugated surface to the support substrate.

Optionally, the light outcoupling layer is a compositionally vertically segregated layer wherein the hydrophobic polymer material is enriched adjacent to the corrugated surface.

Optionally, the light outcoupling layer further comprises a hydrophilic material enriched on a side of the light outcoupling layer proximal to the support substrate.

Optionally, the hydrophilic material is a cross-linked hydrophilic material, a cross-linking density of the hydrophilic cross-linked material increases in the direction from the corrugated surface to the support substrate.

Optionally, the corrugated surface comprises a plurality of corrugated protrusions spaced apart by a plurality of corrugated concaved portions, a distance between two adjacent apexes of the plurality of corrugated protrusions being in the range of approximately 100 nm to approximately 1000 nm, and a height difference between an apex of a corrugated protrusion and a nadir of an adjacent corrugated concaved portion being in the range of approximately 40 nm to approximately 120 nm.

In another aspect, the present invention provides a method of fabricating an organic light emitting diode base substrate comprising forming a film using a material comprising a polymer material and a cross-linkable material on a support substrate; and forming a light outcoupling layer having a corrugated surface on a side of the light outcoupling layer distal to the support substrate by cross-linking the cross-linkable material in the film; the light outcoupling layer so formed comprising the polymer material having a gradient distribution in a direction from the corrugated surface to the support substrate.

Optionally, the cross-linking is performed by irradiating light of a first wavelength on a surface of the film distal to the support substrate.

Optionally, the cross-linking is performed by exposing the surface of the film to the light of the first wavelength passing through a mask plate having a pattern of light transmissive regions, thereby forming the corrugated surface in a selected area on the light outcoupling layer.

Optionally, the material further comprises a cross-linking initiator, and the step of forming the film comprises dissolving the material in a solvent.

Optionally, the solvent comprises an additive for modifying a characteristic of the corrugated surface.

Optionally, the polymer material is a hydrophobic polymer material and the cross-linkable material is a hydrophilic cross-linkable material.

Optionally, the light outcoupling layer formed is a compositionally vertically segregated layer wherein the hydrophobic polymer material is enriched adjacent to the corrugated surface.

Optionally, the material comprises approximately 12% by weight to approximately 15% by weight hydrophilic polymer material.

Optionally, the film has a thickness in the range of approximately 100 μm to approximately 500 μm.

Optionally, the film is irradiated for an irradiation duration in the range of approximately 10 minutes to approximately 40 minutes.

Optionally, the material comprises a fluorinated polymer and trimethyl triacrylate, and the cross-linking initiator in a weight ratio of approximately 12:87.5:0.5, the solvent is dichloromethane, and the cross-linking initiator is 2-methyl-4' (methylthio)-2-morpholinopropiophenone.

Optionally, the solvent comprises an additive for modifying a characteristic of the corrugated surface, and the additive is methanol.

In another aspect, the present invention provides a method of fabricating an organic light emitting display substrate comprising forming an organic light emitting diode base substrate according to a method described herein, and forming array of a plurality of pixels on the base substrate, each of the plurality of pixels comprising at least a subpixel, each subpixel comprising an organic light emitting diode on a side of the corrugated surface in a subpixel region distal to the support substrate.

Optionally, the light outcoupling layer in each subpixel region has a corrugated surface and a non-corrugated surface, the non-corrugated surface surrounding the corrugated surface.

Optionally, the corrugated surface in each subpixel region is formed to have an area that is approximately 60% to approximately 90% of an area of each subpixel region.

In another aspect, the present invention provides an organic light emitting display substrate comprising a base substrate described herein or fabricated by a method described herein; and an array of a plurality of pixels on the base substrate, each of the plurality of pixels comprising at least a subpixel, each subpixel comprising an organic light emitting diode on a side of the corrugated surface in a subpixel region distal to the support substrate.

Optionally, the light outcoupling layer in each subpixel region has a corrugated surface and a non-corrugated surface, the non-corrugated surface surrounding the corrugated surface.

Optionally, the corrugated surface in the subpixel region has an area that is approximately 60% to approximately 90% of an area of each subpixel region.

In another aspect, the present invention provides an organic light emitting display apparatus comprising an organic light emitting display substrate described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
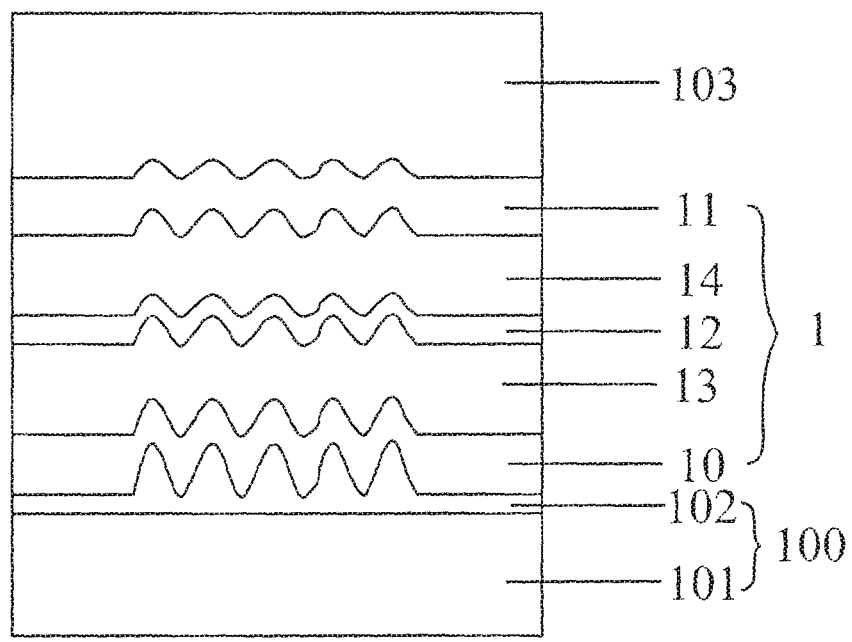
FIG. 1 is a diagram illustrating the structure of an organic light emitting display substrate in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Conventional top-emission type OLEDs have low light outcoupling efficiencies, typically around 20%. Approximately 80% of the emitted light in conventional top-emission type OLEDs is lost at various interfaces such as a substrate-ambient medium interface, layers interface, the cathode layer interface, etc. For example, light may be trapped in a surface plasmon polariton mode, i.e., the lost light is trapped at a surface of a cathode layer. Similarly, light may be trapped in a waveguide mode, i.e., the lost light is trapped within layers of the OLED or the substrate. Light trapped via these modes needs to be extracted to improve the efficiency of the OLEDs.

Conventional surface corrugation techniques such as electron beam, holographic lithography, and nano-imprint lithography, are not suitable for OLED applications because these techniques are expensive and incapable of generating regular patterns. The possibility of using polymeric materials for making light outcoupling layer having a corrugated surface has been explored in the present disclosure. It was discovered in the present disclosure that a corrugated surface (e.g., having a buckled pattern) formed by a regular polymer or resin is not suitable for OLED application because the buckled pattern is typically too large for any meaningful light extraction, e.g., the size and/or spacing of the protrusions on the corrugated surface are too large for any effective light extraction. It was also discovered in the present disclosure a corrugated surface generated by lateral phase separation of cross-linkable materials is not suitable for OLED applications because the surface corrugation cannot be limited to a selected area. Thus, in an OLED having such a light outcoupling layer, light escapes from the edge of the corrugated surface, resulting in a significant pixel blurring effect of the OLED.

The present disclosure is directed to, inter alia, a base substrate for an organic light emitting diode, an organic light emitting display substrate and apparatus having the same, and a fabricating method thereof that substantially obviates one or more of the problems due to limitations and disadvantages of the related art. In one aspect, the present disclosure provides a base substrate for an organic light emitting diode having a first electrode layer, a light emitting layer, and a second electrode layer sequentially stacked together. The base substrate includes a support substrate; and a light outcoupling layer on the support substrate, the light outcoupling layer having a corrugated surface on a side of the light outcoupling layer distal to the support substrate. Optionally, the light outcoupling layer includes a polymer material having a gradient distribution in a direction from the corrugated surface to the support substrate (e.g., vertical phase segregation). For example, the surface portion of the corrugated surface has a greater content of the polymer material, and the content of the polymer material gradually decreases in the direction from the corrugated surface to the support substrate. Optionally, the light outcoupling layer includes a hydrophilic material. Optionally, the hydrophilic material is a hydrophilic cross-linked material. Optionally, the polymer material is a hydrophobic polymer material. Optionally, the light outcoupling layer includes a hydrophobic polymer material and a hydrophilic cross-linked material. Optionally, the light outcoupling layer is a compositionally vertically segregated layer wherein the hydrophobic polymer material is enriched adjacent to the corrugated surface. Optionally, the light outcoupling layer is a compositionally vertically segregated layer wherein the hydrophilic cross-linked material is enriched adjacent to the support substrate.

In some embodiments, the light outcoupling layer includes a hydrophobic polymer material and a hydrophilic material. Optionally, the hydrophobic polymer material is a hydrophobic block co-polymer material. The hydrophilic material may be, for example, a hydrophilic cross-linked material generated from a cross-linkable monomer such as a hydrophilic acrylate cross-linker. Optionally, the hydrophilic material is a hydrophilic cross-linked material generated from a cross-linkable material such as a hydrophilic cross-linked pre-polymer or polymer resin.

Optionally, the light outcoupling layer includes a hydrophobic polymer material having a gradient distribution such that a content of the hydrophobic polymer material decreases in the direction from the corrugated surface to the support substrate, and the hydrophilic material has a gradient distribution such that a content of the hydrophilic material increases in the direction from the corrugated surface to the support substrate.

Optionally, the light outcoupling layer is a compositionally vertically segregated layer wherein the hydrophobic polymer material is enriched adjacent to the corrugated surface, and the hydrophilic material is enriched on a side of the light outcoupling layer proximal to the support substrate.

Optionally, a cross-linking density of the hydrophilic cross-linked material decreases in the direction from the corrugated surface to the support substrate. Optionally, the hydrophobic polymer material has a gradient distribution such that a content of the hydrophobic polymer material decreases in the direction from the corrugated surface to the support substrate, and the cross-linking density of the hydrophilic cross-linked material decreases in the direction from the corrugated surface to the support substrate.

In some embodiments, the light outcoupling layer includes a top layer and a bottom layer. Optionally, the top layer and the bottom layer are vertically segregated. The top layer mainly includes the hydrophobic polymer material. The hydrophobic polymer material in the top layer has a gradient distribution such that a content of the hydrophobic polymer material decreases in the direction from the corrugated surface to the support substrate. The bottom layer mainly includes a hydrophilic cross-linked material. A cross-linking density of the hydrophilic cross-linked material varies in the direction from the corrugated surface to the support substrate. Optionally, the cross-linking density of the hydrophilic cross-linked material increases in the direction from the corrugated surface to the support substrate.

In another aspect, the present disclosure provides an organic light emitting display substrate having a base substrate described herein. The organic light emitting display substrate further includes an array of a plurality of pixels on the base substrate, each of the plurality of pixels having at least a subpixel, each subpixel having an organic light emitting diode in a subpixel region. Optionally, the organic light emitting diode includes a first electrode layer on the base substrate; a light emitting layer on a side of the first electrode layer distal to the base substrate; and a second electrode layer on a side of the light emitting layer distal to the first electrode layer. Optionally, the light outcoupling layer of the base substrate in each subpixel region has a corrugated surface on a side of the light outcoupling layer distal to the support substrate for enhancing light output of the organic light emitting display substrate. Optionally, the organic light emitting diode in each subpixel region is on a side of the corrugated surface in each subpixel region distal to the support substrate. Optionally, the corrugated surface in each subpixel region has an area smaller than an area of each subpixel region, e.g., the light outcoupling layer in each subpixel region has a corrugated surface and a non-corrugated surface, the non-corrugated surface surrounding the corrugated surface. Optionally, the corrugated surface in each subpixel region has an area that is approximately 60% to approximately 90% of an area of each subpixel region. Optionally, the organic light emitting display substrate further includes a pixel definition layer on the base substrate defining a plurality of subpixel regions.

As used herein, the term "corrugated surface" refers to a non-level surface having a plurality of protrusions and a plurality of concaved portions relative to the plurality of protrusions. A corrugated surface may include a wide variety of periodic or non-periodic structuration, deformation, induced roughness, undulation, texturing or the combination thereof. Optionally, the plurality of corrugated protrusions are spaced apart by the plurality of concaved portions. Optionally, the corrugated surface in the context of the present disclosure has a typical distance between two adjacent apexes of the corrugated protrusions in the range of approximately 100 nm to approximately 1000 nm. Optionally, the corrugated surface in the context of the present disclosure has a typical height difference between an apex of a corrugated protrusion and a nadir of an adjacent corrugated concaved portion in the range of approximately 40 nm to approximately 120 nm.

As used herein, the term "polymer material" may refer to homopolymers or copolymers (e.g., block copolymers). Optionally, the polymer material is a halogenated polymer material. Optionally, the polymer material is a fluorinated polymer material. Optionally, the polymer material is a chlorinated polymer material. Optionally, the polymer material is a brominated polymer material. Optionally, the polymer material is a hydrophobic polymer material. The term "halogenated" refers to a monomer, oligomer, or polymer having at least one atom of halogen in at least one constituent unit of the monomer, oligomer, or polymer. Similarly, the term "fluorinated" refers to a monomer, oligomer, or polymer having at least one atom of fluorine in at least one constituent unit of the monomer, oligomer, or polymer, the term "chlorinated" refers to a monomer, oligomer, or polymer having at least one atom of chlorine in at least one constituent unit of the monomer, oligomer, or polymer, and the term "brominated" refers to a monomer, oligomer, or polymer having at least one atom of bromine in at least one constituent unit of the monomer, oligomer, or polymer. Examples of polymer materials include, but are not limited to, a haloalkyl substituted poly (methyl methacrylate), e.g., a fluoroalkyl substituted poly (methyl methacrylate), a chloroalkyl substituted poly (methyl methacrylate), and a bromoalkyl substituted poly (methyl methacrylate), and a haloalkyl substituted poly (n-butylacrylate), e.g., a fluoroalkyl substituted poly (n-butylacrylate), a chloroalkyl substituted poly (n-butylacrylate), and a bromoalkyl substituted poly (n-butylacrylate).

As used herein, the term "cross-linkable material" refers to any cross-linkable monomers, oligomers, polymers, or a combination thereof. Optionally, the cross-linkable material is a hydrophilic cross-linkable material. Optionally, the hydrophilic cross-linkable material is a hydrophilic acrylate. Examples of hydrophilic acrylates include, but are not limited to, trimethylolpropane triacrylate (TMPTA), poly (propylene glycol diacrylate) (PPGDA), and 2.2 Bis[4-(AcryloxyPolyethoxy]Phenyl]Propane(EO 10 mol) (A-BPE-10).

Figure 2:
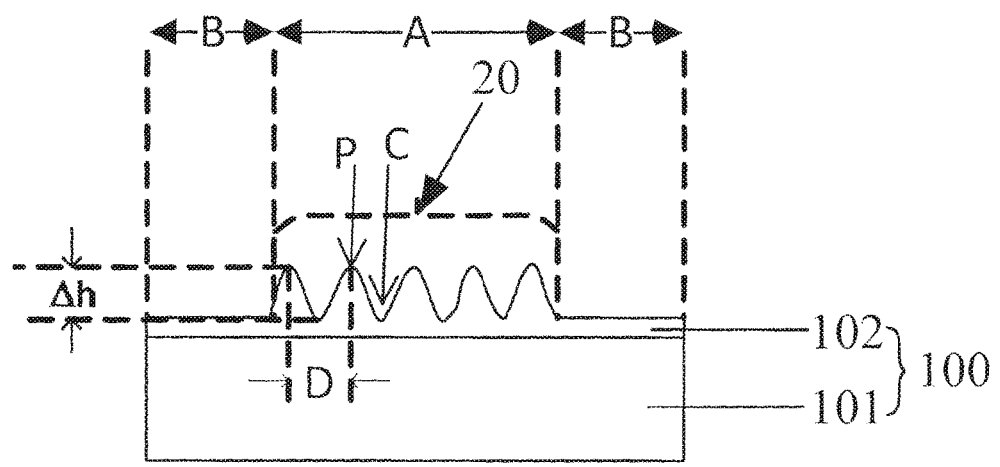
FIG. 2 is a diagram illustrating the structure of a base substrate for an organic light emitting diode in some embodiments.

FIG. 1 is a diagram illustrating the structure of an organic light emitting display substrate in some embodiments. FIG. 2 is a diagram illustrating the structure of a base substrate for an organic light emitting diode in some embodiments. Referring to FIGS. 1 and 2, the OLED 1 in the embodiment includes an anode 10, an organic light emitting layer 12, and a cathode 11 disposed on a base substrate 100. The organic light emitting layer 12 is sandwiched between the anode 10 and the cathode 11. The base substrate 100 includes a support substrate 101, and a light outcoupling layer 102 having a corrugated surface 20. Inclusion of a light outcoupling layer 102 having the corrugated surface 20 on the base substrate 100 significantly increases light outcoupling efficiency and external quantum efficiency of the present OLED 1, and decreases surface plasmon polariton of the OLED 1.

In some embodiments, as shown in FIG. 2, the base substrate 100 includes a first portion A and a second portion B. The first portion A has a corrugated surface 20, and the second portion B has a relatively flat surface. Optionally, the light outcoupling layer 102 is absent in the second portion B. A projection of the first portion A on the base substrate 100 is smaller than a projection of the OLED 1 on the base substrate 100. Accordingly, a first portion of the OLED 1 is disposed on a side of the corrugated surface 20 distal to the support substrate 101, and a second portion of the OLED 1 is disposed on a side of the relatively flat surface distal to the support substrate 101. By have this design, the pixel blurring effect of the OLED 1 may be significantly reduced.

In some embodiments, the OLED 1 further includes a hole transport layer 13 between the anode 10 and the organic light emitting layer 12, and an electron transport layer 14 between the cathode 11 and the organic light emitting layer 12.

In some embodiments, the organic light emitting display substrate is a top-emission type organic light emitting display substrate. Optionally, the anode 10 in the top-emission type organic light emitting display substrate is made of a reflective metal material. Examples of appropriate reflective metal materials for making the reflective anode 10 include, but are not limited to, silver. Optionally, the cathode 11 in the top-emission type organic light emitting display substrate is made of a transparent conductive material. Examples of appropriate transparent conductive materials for making the transparent cathode 11 include, but are not limited to, zinc oxide, indium gallium oxide, indium zinc oxide, indium titanium oxide, and indium gallium zinc oxide.

In some embodiments, the organic light emitting display substrate is a bottom-emission type organic light emitting display substrate. Optionally, the anode 10 in the bottom-emission type organic light emitting display substrate is made of a transparent conductive material. Examples of appropriate transparent conductive materials for making the transparent anode 10 include, but are not limited to, zinc oxide, indium gallium oxide, indium zinc oxide, indium titanium oxide, and indium gallium zinc oxide. Optionally, the cathode 11 in the bottom-emission type organic light emitting display substrate is made of a reflective metal material. Examples of appropriate reflective metal materials for making the reflective cathode 11 include, but are not limited to, silver.

In some embodiments, the organic light emitting display substrate is a dual-emission type organic light emitting display substrate. Optionally, the anode 10 and the cathode 11 are made of a transflective electrode material. Optionally, a portion of the anode 10 is made of a reflective metal material and another portion of anode 10 is made of a transparent conductive material. Optionally, a portion of the cathode 11 is made of a reflective metal material and another portion of cathode 11 is made of a transparent conductive material. Optionally, the base substrate 100 is a transparent base substrate 100.

In some embodiments, the organic light emitting display substrate further includes an encapsulation layer 103. Optionally, the encapsulation layer 103 includes an inorganic insulating layer for insulating the OLED components from external oxygen and moist. Examples of appropriate inorganic insulating materials include, but are not limited to, silicon oxide, silicon nitride (e.g., $Si_3N_4$), silicon oxynitride ($SiO_xN_y$).

In some embodiments, a portion of the OLED 1 is disposed on a side of the corrugated surface 20 distal to the support substrate 101. Optionally, a projection of the corrugated surface 20 on the base substrate 100 has a first area, and a projection of the OLED 1 on the base substrate 100 has a second area, the first area being approximately 60% to approximately 90% of the second area.

Figure 3:
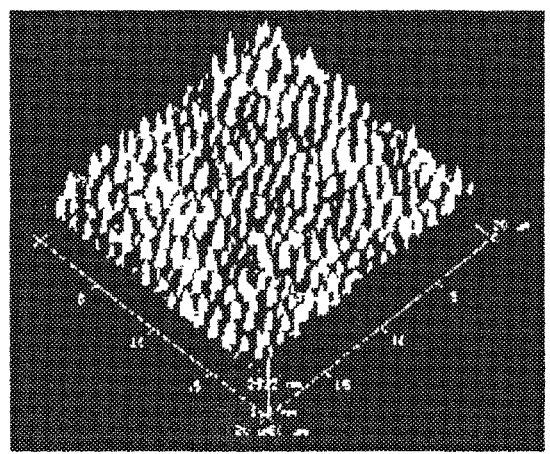
FIG. 3 is an atomic force microscopy image of a corrugated surface of a light outcoupling layer in some embodiments.
Figure 4A:
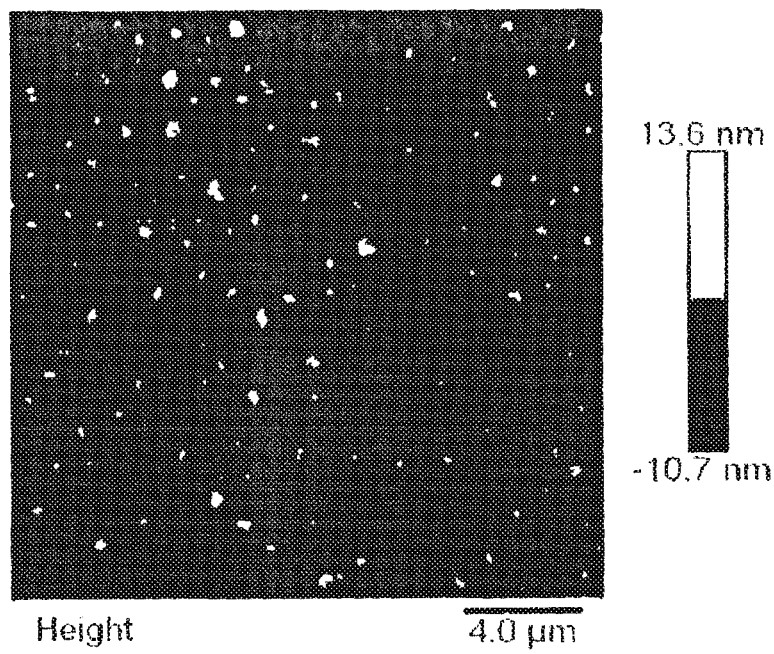
FIGS. 4A-D are atomic force microscopy images of corrugated surfaces of various light outcoupling layers in some embodiments.
Figure 4B:
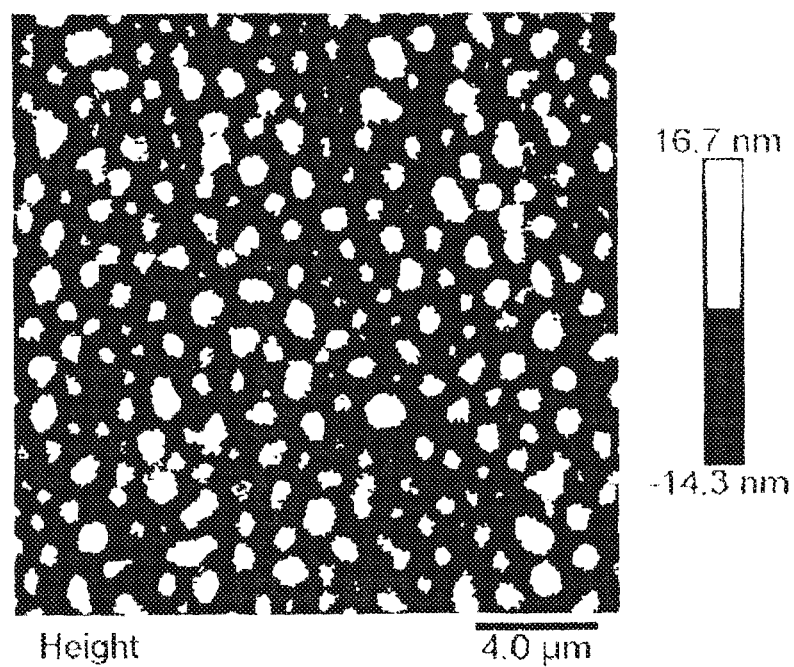
Figure 4C:
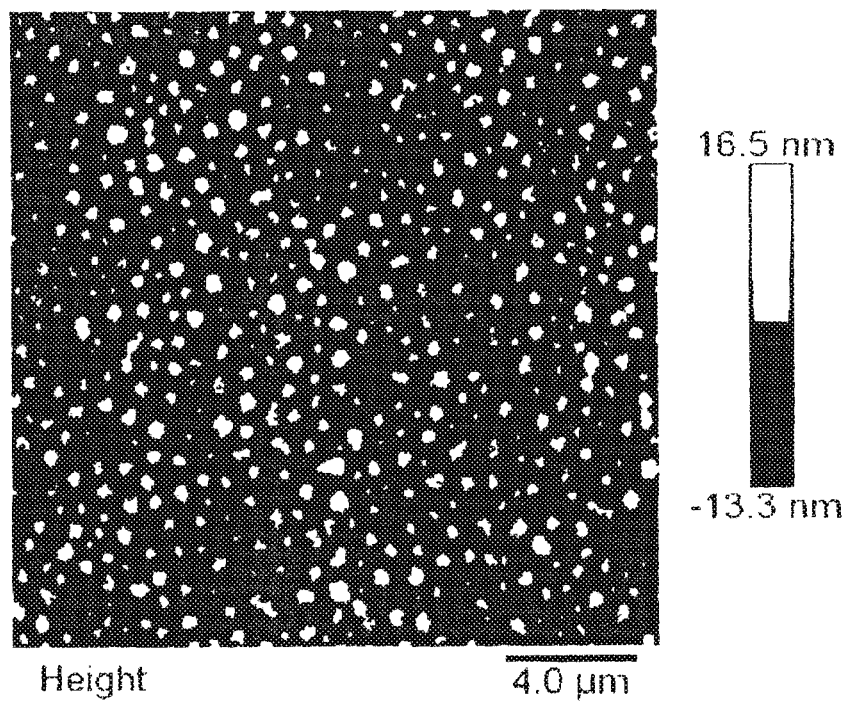
Figure 4D:
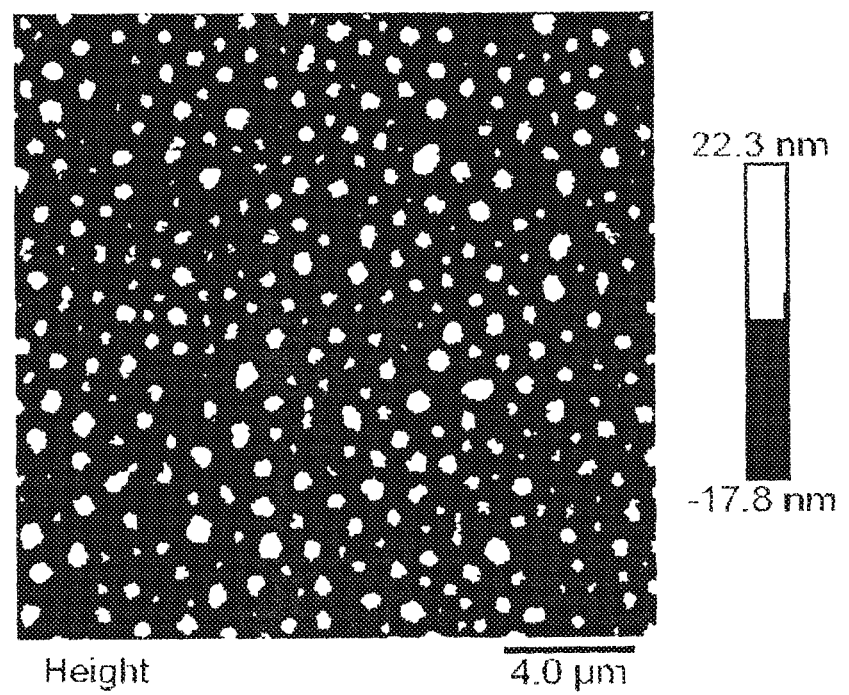

Referring to FIG. 2, the corrugated surface 20 includes a plurality of corrugated protrusions P spaced apart by a plurality of corrugated concaved portions C. Optionally, each corrugated concaved portion C is adjacent to at least one (e.g., two, three, four, or more) corrugated protrusions P. Optionally, each corrugated protrusion P is adjacent to at least one (e.g., two, three, four, or more) corrugated concaved portion C. FIG. 3 is an atomic force microscopy image of a corrugated surface of a light outcoupling layer in some embodiments. Referring to FIG. 3, the corrugated surface includes a plurality of corrugated protrusions spaced apart by a plurality of corrugated concaved portions. Optionally, the corrugated protrusions have a periodicity or pseudo periodicity of approximately 100 nm to approximately 1000 nm, e.g., approximately 100 nm to approximately 500 nm, approximately 500 nm to approximately 750 nm, approximately 750 nm to approximately 1000 nm, or approximately 500 nm to approximately 1000 nm. Optionally, a distance D between two adjacent apexes of the corrugated protrusions are in the range of approximately 100 nm to approximately 1000 nm, e.g., approximately 100 nm to approximately 500 nm, approximately 500 nm to approximately 750 nm, approximately 750 nm to approximately 1000 nm, or approximately 500 nm to approximately 1000 nm. Optionally, a height difference $\Delta h$ between an apex of a corrugated protrusion and a nadir of an adjacent corrugated concaved portion is in the range of approximately 40 nm to approximately 120 nm, e.g., approximately 40 nm to approximately 60 nm, approximately 60 nm to approximately 80 nm, approximately 80 nm to approximately 100 nm, approximately 100 nm to approximately 120 nm, approximately 40 nm to approximately 80 nm, or approximately 80 nm to approximately 100 nm.

In some embodiments, the corrugated surface 20 has a pseudo periodical pattern or non-periodical pattern. For example, apexes of the plurality of corrugated protrusions are non-uniformly distributed on the corrugated surface, and nadirs of the plurality of corrugated concaved portions are non-uniformly distributed on the corrugated surface. Optionally, distances D are non-uniform between each pair of adjacent apexes of the plurality of corrugated protrusions. Optionally, height differences $\Delta h$ are non-uniform between each pair of an apex of a corrugated protrusion and a nadir of an adjacent corrugated concaved portion. Optionally, the distances D distribute over a certain range. Optionally, the height differences $\Delta h$ distribute over a certain range. By having a pseudo periodical pattern or non-periodical pattern, the light outcoupling layer is compatible for emitting light of various colors. Moreover, by having a corrugated surface 20 having a pseudo periodical pattern or non-periodical pattern, viewing angle dependence due to microcavity effects in a top-emission type OLED may be reduced. Optionally, a corrugated surface having a relatively larger distance D is used for emitting light of a relatively longer wavelength (e.g., used in a red light emitting OLED), as compared to a corrugated surface having a relatively smaller distance D.

In some embodiments, the light outcoupling layer is made by self-buckling of a mixture having a polymer material and a cross-linkable material to form the corrugated surface. For example, a self-bulking process may include knife-coating (e.g., by doctor blade method) a film having a polymer material and a cross-linkable material suitable for cross-linking on the support substrate; and cross-linking the cross-linkable material in the film to generate a cross-linked material. The resulting film has a gradient distribution of the polymer material in a direction from the corrugated surface to the support substrate, e.g., a content of the polymer material decreases in the direction from the corrugated surface to the support substrate. Optionally, a cross-linking density of the cross-linkable material gradually varies in a direction from the corrugated surface to the support substrate, e.g., the cross-linking density gradually increases in the direction from the corrugated surface to the support substrate. Optionally, the cross-linking is performed by irradiating the film with light of a suitable wavelength (e.g., UV light). The surface portion of the film has a greater content of the polymer material (e.g., a hydrophobic polymer material). The cross-linkable material in the surface portion of the film has a degree of cross-linking different from that of the cross-linkable material in an interior portion of the film, resulting in stress and strain in the film. Optionally, a cross-linking density of the hydrophobic cross-linked material increases in the direction from the corrugated surface to the support substrate. The stress and strain in the film induces the film to expand towards its surface in order to release the stress and strain. When the stress and strain is released in the expanded surface, portions of the expanded surface crimple, forming a corrugated surface. Optionally, the cross-linking of the material in the film is induced by light of a suitable wavelength (e.g., UV light), the surface regions to be corrugated in the film may be easily controlled by selectively irradiating the light only in regions corresponding to the corrugated surface.

Referring to FIG. 2, the base substrate 100 includes a support substrate 101 and a light outcoupling layer 102 on the support substrate 101. The light outcoupling layer 102 is made of the mixture having the polymer material and the cross-linkable material suitable for cross-linking. The light outcoupling layer 102 has a corrugated surface 20 on a side of the light outcoupling layer 102 distal to the support substrate 101. Optionally, the OLED is disposed on a side of the corrugated surface 20 of the light outcoupling layer 102 distal to the support substrate 101. Optionally, the cross-linkable material suitable for cross-linking includes a cross-linkable polymer. Optionally, the cross-linkable material suitable for cross-linking includes a cross-linkable monomer. Optionally, the support substrate 101 is a transparent support substrate 101, e.g., a glass substrate, a quartz substrate, or an organic resin substrate.

In some embodiments, the cross-linkable material suitable for cross-linking includes a hydrophobic polymer material and a hydrophilic cross-linkable material. Optionally, the light outcoupling layer is a compositionally vertically segregated layer wherein the hydrophobic polymer material is enriched adjacent to the corrugated surface. Optionally, the light outcoupling layer is a compositionally vertically segregated layer wherein the hydrophilic cross-linked material is enriched adjacent to the support substrate. Optionally, the light outcoupling layer is a compositionally vertically segregated layer wherein the hydrophobic polymer material is enriched adjacent to the corrugated surface and the hydrophilic cross-linked material is enriched adjacent to the support substrate. Optionally, the hydrophobic polymer material is enriched on a side of the light outcoupling layer 102 distal to the support substrate 101, e.g., on or proximal to a surface of the light outcoupling layer 102 distal to the support substrate 101. Under the light of a suitable wavelength (e.g., UV light), the hydrophilic cross-linkable material in the surface portion of the light outcoupling layer 102 cross-links to a cross-linking degree different from that of the hydrophilic cross-linkable material in an interior portion of the light outcoupling layer 102, resulting in stress and strain in the film. The hydrophilic cross-linkable material (or hydrophilic cross-linked material) on or proximal to the surface of the film expands towards the surface, relative to the hydrophilic cross-linkable material (or hydrophilic cross-linked material) in the interior portions of the film. When the stress and strain is released in the expanded surface, portions of the expanded surface crimple, forming a corrugated surface 20. Optionally, the hydrophilic cross-linkable material is TMPTA. Optionally, the hydrophobic polymer material is a fluorinated polymer.

The periodicity or pseudo periodicity of the corrugated surface 20 varies depending on the magnitude of stress and strain as well as several other factors. In some embodiments, apexes of the plurality of corrugated protrusions are non-uniformly distributed on the corrugated surface, and nadirs of the plurality of corrugated concaved portions are non-uniformly distributed on the corrugated surface. Optionally, distances D (D is a distance between two adjacent apexes of the corrugated protrusions) are non-uniform between each pair of adjacent apexes of the plurality of corrugated protrusions. Optionally, height differences Δh (Δh is a height difference between an apex of a corrugated protrusion and a nadir of an adjacent corrugated concaved portion) are non-uniform between each pair of an apex of a corrugated protrusion and a nadir of an adjacent corrugated concaved portion. Optionally, the distances D distribute over a certain range. Optionally, the height differences Δh distribute over a certain range. Accordingly, the corrugated surface 20 has a pseudo periodical or non-periodical pattern. By having a pseudo periodical or non-periodical pattern, the light outcoupling layer 102 is compatible for emitting light of various colors. Moreover, by having a corrugated surface 20 having a pseudo periodical or non-periodical pattern, viewing angle dependence due to microcavity effects in a top-emission type OLED may be reduced. Optionally, the distance D between two adjacent apexes of the corrugated protrusions has a value in the range of approximately 100 nm to approximately 1000 nm. Optionally, the height difference Δh between an apex of a corrugated protrusion and a nadir of an adjacent corrugated concaved portion has a value in the range of approximately 40 nm to approximately 120 nm.

In a process of fabricating the base substrate 100, cross-linking of the cross-linkable material in the film may be induced by light of a suitable wavelength (e.g., UV light). The cross-linking of the cross-linkable material in the film produces a self-buckled structure leading to the corrugated surface 20 in the light outcoupling layer 102. In some embodiments, a mask plate may be used for selectively irradiating a selected region of the film, thus selectively controlling a region of the film in which the cross-linkable material is to be cross-linked. By selectively irradiating the light only in regions corresponding to the corrugated surface, a corrugated surface 20 in a selected portion of the base substrate 100 may be formed. Optionally, a projection of the corrugated surface 20 on the base substrate 100 has a first area, and a projection of the OLED on the base substrate 100 has a second area, the first area being approximately 60% to approximately 90% of the second area.

Accordingly, the present disclosure provides a display substrate, e.g., an OLED display substrate having a plurality of pixels. Each pixel includes at least one subpixel. Each subpixel includes a subpixel region and an inter-subpixel region. In some embodiments, the OLED display substrate includes a pixel definition layer on the base substrate for defining a plurality of subpixel regions. An OLED is disposed in each of the plurality of subpixel regions on the base substrate. In each subpixel region, the base substrate has a corrugated surface, on which the OLED is disposed. By using a base substrate having a corrugated surface, light outcoupling efficiency of the OLED may be significantly increased.

As used herein, a subpixel region refers to a light emission region of a subpixel, such as a region corresponding to a light emissive layer in an organic light emitting display. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

In some embodiments, the corrugated surface in each subpixel has an area smaller than that of a subpixel region in the subpixel, which is substantially the same as an area of a projection of the OLED on the base substrate. Optionally, only a portion of the OLED is disposed on the corrugated surface, e.g., the light outcoupling layer in each subpixel region has a corrugated surface and a non-corrugated surface, the non-corrugated surface surrounding the corrugated surface. Optionally, the corrugated surface is formed in a central portion of the base substrate, and the peripheral portion of the base substrate has a relatively flat surface. Optionally, the light outcoupling layer is substantially absent in the peripheral portion. By having this design, pixel blurring effect due to light scattering and escaping from edges of the corrugated surface may be prevented, and viewing angle dependence due to microcavity effects in a top-emission type OLED may be reduced. Optionally, the corrugated surface in each subpixel has an area that is approximately 60% to approximately 90% (e.g., approximately 60% to approximately 70%, approximately 70% to approximately 80%, or approximately 80% to approximately 90%) of that of the subpixel region in the subpixel for preventing pixel blurring effect and increasing light outcoupling efficiency of the OLED.

In some embodiments, the base substrate of the present OLED display substrate includes a support substrate and a light outcoupling layer on the support substrate. At least a portion of the base substrate has a corrugated surface. Optionally, the OLED is disposed on a side of the light outcoupling layer distal to the support substrate. Optionally, the light outcoupling layer is made of a material including a polymer material and a cross-linkable material suitable for cross-linking. The light outcoupling layer having a corrugated surface on a side of the light outcoupling layer distal to the support substrate is formed by cross-linking the material in the film. The light outcoupling layer so formed includes a polymer material having a gradient distribution in a direction from the corrugated surface to the support substrate. Optionally, the corrugated surface is formed by cross-linking the cross-linkable material by irradiating the cross-linkable material with light of a suitable wavelength (e.g., UV light), e.g., by exposing the surface of the film to the light of the first wavelength passing through a mask plate having a pattern of light transmissive regions, thereby forming the corrugated surface in a selected area on the light outcoupling layer.

In another aspect, the present disclosure provides a display apparatus having a display substrate described herein. As compared to the conventional OLED display apparatus, the present display apparatus has the advantages of enhanced image display brightness, lower power consumption, reduced image blurring, as well as reduced viewing angle dependence (due to microcavity effects in a top-emission type OLED).

Figure 6:
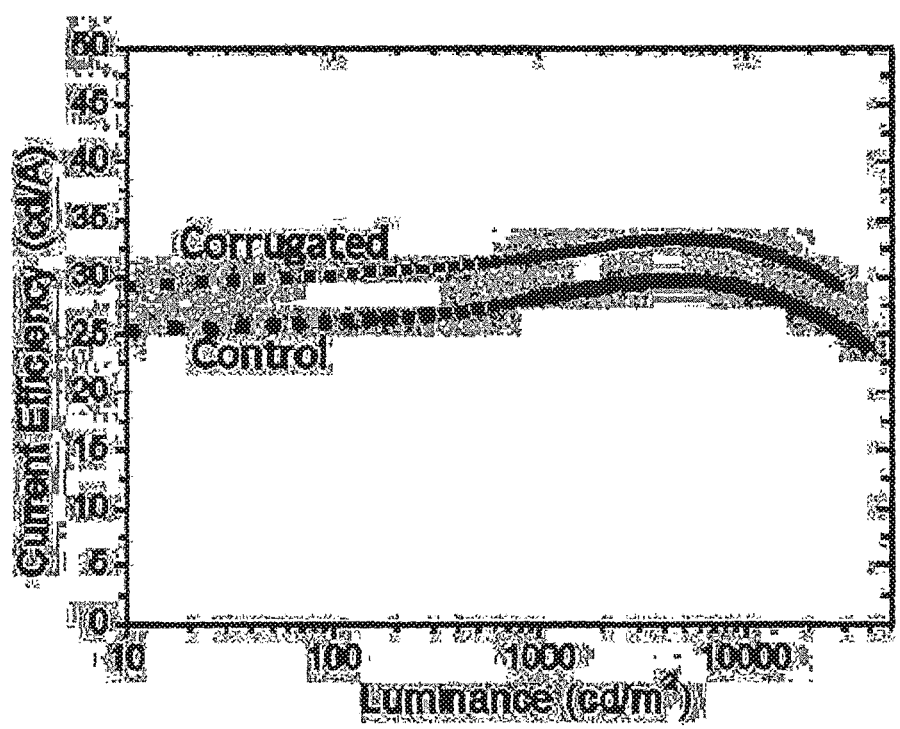
FIG. 6 shows current efficiency-luminance curves in a convention OLED apparatus (control) and an OLED display apparatus having a base substrate with a corrugated surface in some embodiments.

FIG. 6 shows current efficiency-luminance curves in a convention OLED display apparatus ("Control") and an OLED display apparatus having a base substrate with a corrugated surface in some embodiments ("Corrugated"). Referring to FIG. 6, the present OLED display apparatus has an enhanced current efficient as compared to the convention OLED display apparatus. Thus, power consumption of the present OLED display apparatus may be reduced.

In another aspect, the present disclosure provides a method of fabricating an OLED display substrate. In some embodiments, the method includes forming a base substrate; and forming an OLED on the base substrate. Optionally, the step of forming the base substrate includes forming a corrugated surface on the base substrate. Optionally, the step of forming the OLED on the base substrate includes forming the OLED on the corrugated surface of the base substrate. An OLED display substrate fabricated according to the present method has an enhanced light outcoupling efficiency.

Optionally, a projection of the corrugated surface on the base substrate is smaller than a projection of the OLED on the base substrate. By having this design, pixel blurring effect may be prevented in an OLED display apparatus having an OLED display substrate fabricated according to the present method. Optionally, the light outcoupling layer in each subpixel region has a corrugated surface and a non-corrugated surface, the non-corrugated surface surrounding the corrugated surface.

In some embodiments, the step of forming the base substrate includes forming a film made of a material having a polymer material and a cross-linkable material suitable for cross-linking on a support substrate; forming a light outcoupling layer having a corrugated surface on a side of the light outcoupling layer distal to the support substrate by cross-linking the cross-linkable material in the film. The light outcoupling layer so formed includes a polymer material having a gradient distribution in a direction from the corrugated surface to the support substrate. Optionally, the cross-linking is a gradient cross-linking wherein a degree of cross-linking of the cross-linkable material increases in the direction from the corrugated surface to the support substrate. The cross-linking may be performed by, e.g., irradiating a surface on a side of the film distal to the support substrate with light of a first wavelength thereby forming a light outcoupling layer having a corrugated surface. Optionally, only a portion of the film is irradiated by the light of the first wavelength. Optionally, the step of cross-linking includes exposing the film to the light of the first wavelength passing through a mask plate having a pattern of light transmissive regions thereby forming the corrugated surface in a selected area on the light outcoupling layer.

Various appropriate gradient cross-linking methods may be used to generate the cross-linked material. Examples of appropriate gradient cross-linking methods include, but are not limited to, cross-linking by irradiation and glutaraldehyde vapor deposition. Alternatively, the cross-linking may be performed by a non-gradient cross-linking method. For example, the cross-linking may be initiated by heat, pH, or by addition of chemicals such as peroxide.

The present fabricating method provides a convenient way of making a partially corrugated surface on the base substrate using a mask plate. The present method is cost effective and processable for OLED display apparatus manufacturing.

Optionally, the cross-linkable material suitable for cross-linking includes a polymer. Optionally, the cross-linkable material suitable for cross-linking includes a monomer.

In some embodiments, the film is made by a cross-linkable material suitable for cross-linking and a cross-linking initiator for initiating cross-linking. Optionally, the cross-linkable material is dissolved in a solvent for making the film. Corrugated surfaces having various characteristics (e.g., periodicity) may be obtained by adjusting the compositions of the cross-linkable material, e.g., a relative ratio of various components of the cross-linkable material, or by including an additive in the solvent.

In some embodiments, the characteristics of the corrugated surface may be modified by adjusting various parameters such as thickness of the film, irradiation duration of the light of the first wavelength, and irradiation atmosphere. Optionally, the thickness of the film is in the range of approximately 100 µm to approximately 500 µm. Optionally, the irradiation duration is in the range of approximately 5 minutes to approximately 40 minutes. Optionally, the irradiation atmosphere is ambient atmosphere or an inert gas atmosphere.

Optionally, the characteristics of the corrugated surface includes periodicity of the corrugated surface. Optionally, the characteristics of the corrugated surface includes roughness of the corrugated surface. Optionally, the characteristics of the corrugated surface includes a distance between two adjacent apexes of the corrugated protrusions. Optionally, the characteristics of the corrugated surface includes a height difference between an apex of a corrugated protrusion and a nadir of an adjacent corrugated concaved portion.

In some embodiments, the cross-linkable material suitable for cross-linking includes a hydrophobic polymer material and a hydrophilic cross-linkable material. The cross-linked material so formed includes a hydrophobic polymer material having a gradient distribution such that a content of the hydrophobic polymer material decreases in the direction from the corrugated surface to the support substrate. Optionally, when irradiated by the light of the first wavelength, the hydrophilic cross-linkable material on the surface portion of the light outcoupling layer has a degree of cross-linking different from that of the hydrophilic cross-linkable material in an interior portion of the light outcoupling layer. Optionally, a cross-linking density of the hydrophilic cross-linked material increases in the direction from the corrugated surface to the support substrate. Optionally, the gradient distribution of the hydrophobic polymer material in the film may be achieved, in part, due to the interface energy between the hydrophilic cross-linkable material and air. The hydrophobic material self-assembles at the interface between the hydrophilic cross-linkable material and air because of its lower surface energy, thereby forming the vertically segregated layer. Optionally, the cross-linking density of the hydrophilic cross-linked material increases in the direction from the corrugated surface to the support substrate.

Optionally, the material for forming the corrugated surface is a mixture including a hydrophobic polymer material and a hydrophilic cross-linkable material. Optionally, the mixture is dissolved in dichloromethane. Optionally, the mixture is dissolved in a solvent including dichloromethane and methanol. The characteristics of the corrugated surface may be modified by adjusting a relative ratio of dichloromethane to methanol in the solvent. The characteristics of the corrugated surface may also be modified by adjusting a percentage (e.g., by weight) of the hydrophobic polymer material. Optionally, the mixture includes approximately 12% by weight to approximately 15% by weight hydrophobic polymer material.

In some embodiments, the material for forming the corrugated surface is a mixture including a fluorinated polymer, TMPTA, and a cross-linking initiator. The fluorinated polymer is used as the polymer material in the mixture, and TMPTA is the hydrophilic cross-linkable material. Optionally, the mixture is dissolved in dichloromethane. Optionally, the fluorinated polymer, TMPTA, and the cross-linking initiator in the mixture has a weight ratio of approximately 12:87.5:0.5. Optionally, the cross-linking initiator is a photoinitiator. Optionally, the photoinitiator is 2-methyl-4' (methylthio)-2-morpholinopropiophenone. In one specific example, 10 grams of a mixture of the fluorinated polymer, TMPTA, and the cross-linking initiator is dissolved in 20 ml dichloromethane.

Figure 7:
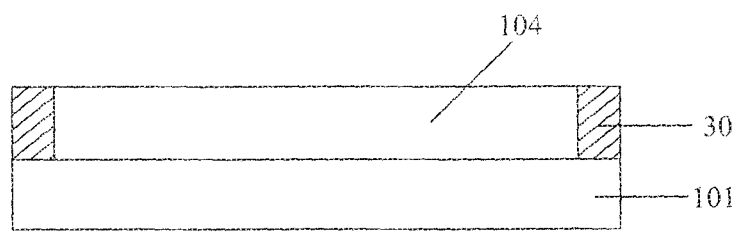
FIGS. 7-9 illustrates a process of fabricating a base substrate in some embodiments.
Figure 8:
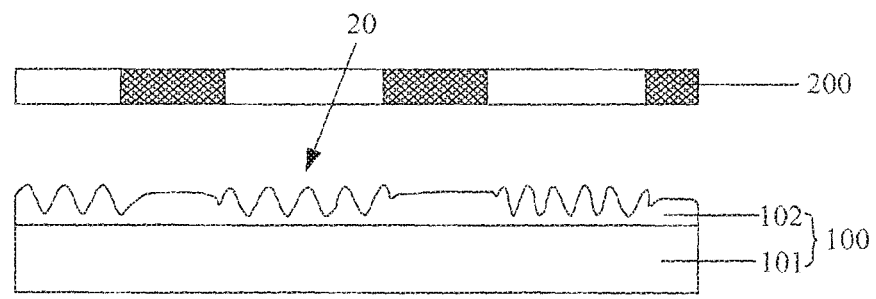
Figure 9:
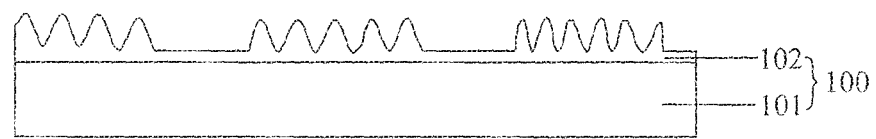

FIGS. 7-9 illustrates a process of fabricating a base substrate in some embodiments. Referring to FIG. 7, the material for forming the corrugated surface is coated (e.g., knife-coated by doctor-blade method) on a support substrate 101 to form a film 104. Optionally, the film is formed to have a thickness in the range of approximately 100 µm to approximately 500 µm. The support substrate 101 having the film 104 is then heated at approximately 60 degrees Celsius for approximately 10 minutes to evaporate the solvent in the film 104.

Referring to FIG. 8, the film is irradiated with UV light having a wavelength of 365 nm passing through a mask plate 200 for approximately 30 minutes. The mask plate 20 has a pattern of a plurality of light transmissive regions. Under the UV light, the photoinitiator initiates the cross-linking of TMPTA, resulting in cross-linking of TMPTA in the exposed regions of the film. The process generates a light outcoupling layer 102 having a corrugated surface 20 in the exposed regions. The light outcoupling layer 102 is then cured by heating. As shown in FIG. 8, each light transmissive region of the mask plate corresponds to a corrugated surface 20. Using the mask plate having a pattern of a plurality of light transmissive regions, a plurality of OLEDs may be formed on a same support substrate, each OLED is disposed on a corrugated surface 20. The cross-linked material in the light outcoupling layer includes a fluorinated polymer having a gradient distribution such that a content of the fluorinated polymer decreases in the direction from the corrugated surface to the support substrate.

Referring to FIG. 9, the film in the unexposed regions (i.e., the portions of the film in which the cross-linkable material is substantially not cross-linked) is removed, e.g., by wet etching.

FIGS. 4A-D are atomic force microscopy images of corrugated surfaces of various light outcoupling layers in some embodiments. The film in FIG. 4A has a thickness of approximately 40 μm, and is made of a mixture having approximately 12% by weight fluorinated polymer. The film in FIG. 4B has a thickness of approximately 60 μm, and is made of a mixture having approximately 12% by weight fluorinated polymer. The film in FIG. 4C has a thickness of approximately 40 μm, and is made of a mixture having approximately 15% by weight fluorinated polymer. The film in FIG. 4D has a thickness of approximately 60 μm, and is made of a mixture having approximately 15% by weight fluorinated polymer. As shown in FIGS. 4A-D, the characteristics of the corrugated surfaces of the light outcoupling layers may be modified by the percentage by weight of the fluorinated polymer and the thickness of the film. For example, the distribution density of the corrugated protrusions and corrugated concaved portions may be increased by increasing the weight percentage of the fluorinated polymer, e.g., a spacing among the corrugated protrusions may be decreased by increasing the weight percentage of the fluorinated polymer (comparing FIG. 4A with 4C or comparing FIG. 4B with 4D). Similarly, the sizes of the corrugated protrusions may be increased by increasing the thickness of the film (comparing FIG. 4A with 4B or comparing FIG. 4B with 4D).

The light outcoupling layer may be made of any appropriate thickness. Optionally, the light outcoupling layer has a thickness in the range of approximately 40 nm to approximately 400 nm, e.g., approximately 40 nm to approximately 100 nm, approximately 100 nm to approximately 200 nm, approximately 200 nm to approximately 300 nm, and approximately 300 nm to approximately 400 nm.

In some embodiments, the material for making the light outcoupling layer is a mixture including a fluorinated polymer, TMPTA, and a cross-linking initiator. The fluorinated polymer is used as the polymer material in the mixture, and TMPTA is the hydrophilic cross-linkable material. In one example, the mixture is dissolved in a solvent including dichloromethane and methanol. Optionally, the fluorinated polymer, TMPTA, and the cross-linking initiator in the mixture has a weight ratio of approximately 12:87.5:0.5. Optionally, the cross-linking initiator is a photoinitiator. Optionally, the photoinitiator is 2-methyl-4' (methylthio)-2-morpholinopropiophenone. Optionally, the solvent includes methanol and dichloromethane in a volume ratio of 1:9. In one specific example, 10 grams of a mixture of the fluorinated polymer, TMPTA, and the cross-linking initiator is dissolved in 20 ml solvent.

Referring to FIG. 7, the material for making the light outcoupling layer is coated (e.g., knife-coated by doctor-blade method) on a support substrate 101 to form a film 104. Optionally, the film is formed to have a thickness in the range of approximately 100 μm to approximately 500 μm. The support substrate 101 having the film 104 is then heated at approximately 60 degrees Celsius for approximately 10 minutes to evaporate the solvent in the film 104.

Referring to FIG. 8, the film is irradiated with UV light having a wavelength of 365 nm passing through a mask plate 200 for approximately 30 minutes. The mask plate 20 has a pattern of a plurality of light transmissive regions. Under the UV light, the photoinitiator initiates the cross-linking of TMPTA, resulting in cross-linking of TMPTA in the exposed regions of the film. The process generates a light outcoupling layer 102 having a corrugated surface 20 in the exposed regions. The light outcoupling layer 102 is then cured by heating. As shown in FIG. 8, each light transmissive region of the mask plate corresponds to a corrugated surface 20. Using the mask plate having a pattern of a plurality of light transmissive regions, a plurality of OLEDs may be formed on a same support substrate, each OLED is disposed on a corrugated surface 20. The cross-linked material in the light outcoupling layer includes a fluorinated polymer having a gradient distribution such that a content of the fluorinated polymer decreases in the direction from the corrugated surface to the support substrate.

Referring to FIG. 9, the film in the unexposed regions (i.e., the portions of the film in which the cross-linkable material is substantially not cross-linked) is removed, e.g., by wet etching.

Figure 5A:
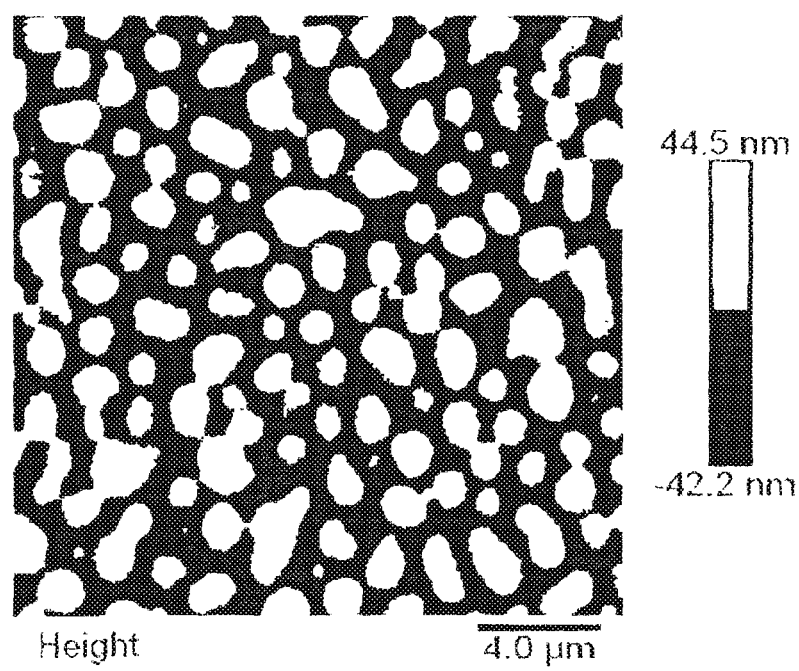
FIGS. 5A-B are atomic force microscopy images of corrugated surfaces of various light outcoupling layers in some embodiments.
Figure 5B:
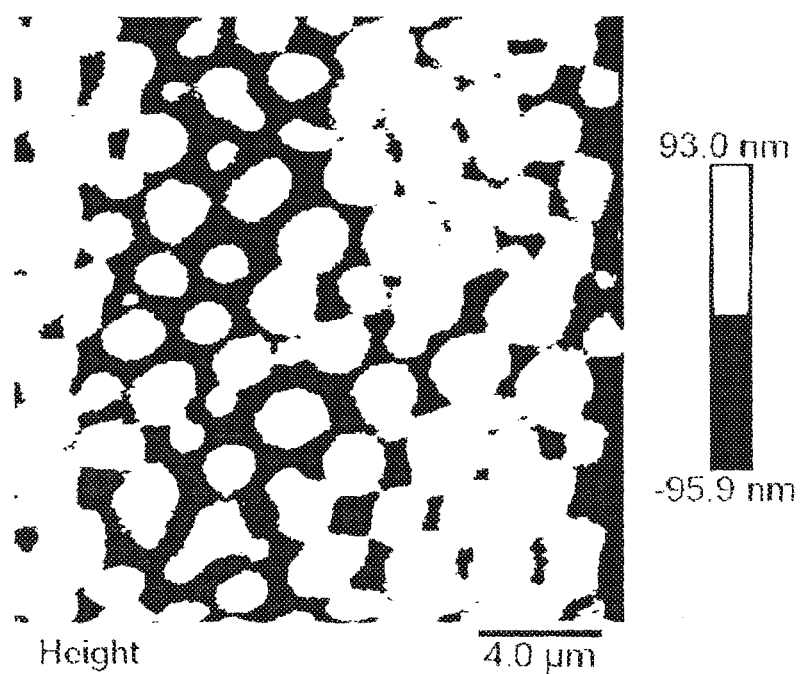

FIGS. 5A-B are atomic force microscopy images of corrugated surfaces of various light outcoupling layers in some embodiments. The film in FIG. 5A has a thickness of approximately 40 μm, and is made of a mixture having approximately 15% by weight fluorinated polymer. The film in FIG. 5B has a thickness of approximately 60 μm, and is made of a mixture having approximately 15% by weight fluorinated polymer. As shown in FIGS. 5A-B, the characteristics of the corrugated surfaces of the light outcoupling layers are affected by the thickness of the film. For example, the sizes of the corrugated protrusions may be increased by increasing the thickness of the film (comparing FIG. 5A with 5B or comparing FIG. 4B with 4D).

In some embodiments, the thickness of the film 104 is controlled by using a transparent tape. As shown in FIG. 7, a transparent tape 30 is secured around the support substrate 101, forming a barrier having a thickness. The thickness of the barrier formed by the transparent tape 30 may be adjusted for making a film 104 of a certain thickness.

In another aspect, the present disclosure provides a method of fabricating a display substrate, which incorporates a process of making an OLED as described herein. A display substrate fabricated according to the present method has an enhanced current efficiency and reduced image blurring.

In some embodiments, the display substrate is an OLED display substrate. Each subpixel region of the OLED display substrate includes an OLED. A plurality of OLEDs in a plurality of subpixel regions are formed on a same base substrate. Each subpixel region has a corrugated surface. Each of the plurality of OLEDs is formed on each corrugated surface.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode base substrate, comprising:
    a support substrate; and
    a light outcoupling layer on the support substrate for enhancing light outcoupling efficiency of an organic light emitting display substrate, the light outcoupling layer having a corrugated surface on a side of the light outcoupling layer distal to the support substrate, the light outcoupling layer comprising a polymer material having a gradient distribution in a direction from the corrugated surface to the support substrate;
    wherein the polymer material comprises a hydrophobic polymer material having a gradient distribution such that a content of the hydrophobic polymer material decreases in the direction from the corrugated surface to the support substrate.

2. The base substrate of claim 1, wherein the hydrophobic polymer material comprises a fluorinated polymer.

3. The base substrate of claim 1, wherein the light outcoupling layer further comprises a hydrophilic material having a gradient distribution such that a content of the hydrophilic material increases in the direction from the corrugated surface to the support substrate.

4. The base substrate of claim 1, wherein the light outcoupling layer is a compositionally vertically segregated layer wherein the hydrophobic polymer material is enriched adjacent to the corrugated surface.

5. The base substrate of claim 4, wherein the light outcoupling layer further comprises a hydrophilic material enriched on a side of the light outcoupling layer proximal to the support substrate.

6. The base substrate of claim 3, wherein the hydrophilic material is a cross-linked hydrophilic material, a cross-linking density of the hydrophilic cross-linked material increases in the direction from the corrugated surface to the support substrate.

7. The base substrate of claim 1, wherein the corrugated surface comprises a plurality of corrugated protrusions spaced apart by a plurality of corrugated concaved portions, a distance between two adjacent apexes of the plurality of corrugated protrusions being in the range of approximately 100 nm to approximately 1000 nm, and a height difference between an apex of a corrugated protrusion and a nadir of an adjacent corrugated concaved portion being in the range of approximately 40 nm to approximately 120 nm.

8. An organic light emitting display substrate, comprising:
    a base substrate of claim 1; and
    an array of a plurality of pixels on the base substrate, each of the plurality of pixels comprising at least a subpixel, each subpixel comprising an organic light emitting diode on a side of the corrugated surface in a subpixel region distal to the support substrate.

9. The organic light emitting display substrate of claim 8, wherein the light outcoupling layer in each subpixel region has a corrugated surface and a non-corrugated surface, the non-corrugated surface surrounding the corrugated surface.

10. The organic light emitting display substrate of claim 8, wherein the corrugated surface in the subpixel region has an area that is approximately 60% to approximately 90% of an area of each subpixel region.

11. An organic light emitting display apparatus, comprising an organic light emitting display substrate of claim 8.

12. A method of fabricating an organic light emitting diode base substrate, comprising:
    forming a film using a material comprising a polymer material and a cross-linkable material on a support substrate; and
    forming a light outcoupling layer having a corrugated surface on a side of the light outcoupling layer distal to the support substrate by cross-linking the cross-linkable material in the film; the light outcoupling layer so formed comprising the polymer material having a gradient distribution in a direction from the corrugated surface to the support substrate;
    wherein the polymer material comprises a hydrophobic polymer material having a gradient distribution such that a content of the hydrophobic polymer material decreases in the direction from the corrugated surface to the support substrate.

13. The method of claim 12, wherein the cross-linking is performed by irradiating light of a first wavelength on a surface of the film distal to the support substrate; and exposing the surface of the film to the light of the first wavelength passing through a mask plate having a pattern of light transmissive regions, thereby forming the corrugated surface in a selected area on the light outcoupling layer.

14. The method of claim 12, wherein the material further comprises a cross-linking initiator, and the step of forming the film comprises dissolving the material in a solvent.

15. The method of claim 12, wherein the polymer material is a hydrophobic polymer material and the cross-linkable material is a hydrophilic cross-linkable material; the light outcoupling layer formed is a compositionally vertically segregated layer wherein the hydrophobic polymer material is enriched adjacent to the corrugated surface.

16. The method of claim 15, wherein the material comprises approximately 12% by weight to approximately 15% by weight hydrophilic polymer material; and the film has a thickness in the range of approximately 100 μm to approximately 500 μm.

17. The method of claim 14, wherein the material comprises a fluorinated polymer and trimethyl triacrylate, and the cross-linking initiator in a weight ratio of approximately 12:87.5:0.5, the solvent is dichloromethane, and the cross-linking initiator is 2-methyl-4' (methylthio)-2-morpholinopropiophenone.

18. A method of fabricating an organic light emitting display substrate, comprising:
    forming an organic light emitting diode base substrate according to a method of claim 12; and
    forming array of a plurality of pixels on the base substrate, each of the plurality of pixels comprising at least a subpixel, each subpixel comprising an organic light emitting diode on a side of the corrugated surface in a subpixel region distal to the support substrate.

19. The method of claim 18, wherein the light outcoupling layer in each subpixel region has a corrugated surface and a non-corrugated surface, the non-corrugated surface surrounding the corrugated surface.

20. The method of claim 18, wherein the corrugated surface in each subpixel region is formed to have an area that is approximately 60% to approximately 90% of an area of each subpixel region.

* * * * *